(12) United States Patent
Hermann (10) Patent No.: US 11,262,775 B2
(45) Date of Patent: Mar. 1, 2022

(54) ELECTRIC CIRCUIT FOR THE SAFE RAMP-UP AND RAMP-DOWN OF A CONSUMER

(71) Applicant: Robert Bosch GmbH, Stuttgart (DE)

(72) Inventor: Carsten Hermann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/962,179

(22) PCT Filed: Jan. 15, 2019

(86) PCT No.: PCT/EP2019/050875
§ 371 (c)(1),
(2) Date: Aug. 25, 2020

(87) PCT Pub. No.: WO2019/141654
PCT Pub. Date: Jul. 25, 2019

(65) Prior Publication Data
US 2020/0387183 A1  Dec. 10, 2020

(30) Foreign Application Priority Data

Jan. 17, 2018  (DE) .................... 10 2018 200 704.7

(51) Int. Cl.
| | | |
|---|---|---|
| *G05F 1/56* | (2006.01) | |
| *G05F 1/46* | (2006.01) | |
| *H03K 5/24* | (2006.01) | |
| *H03K 19/20* | (2006.01) | |

(52) U.S. Cl.
CPC ............. *G05F 1/56* (2013.01); *G05F 1/468* (2013.01); *H03K 5/24* (2013.01); *H03K 19/20* (2013.01)

(58) Field of Classification Search
None
See application file for complete search history.

(56) References Cited

U.S. PATENT DOCUMENTS

| | | |
|---|---|---|
| 5,349,286 A | 9/1994 | Marshall et al. |
| 7,804,284 B1 | 9/2010 | Wong |
| 8,058,910 B1 | 11/2011 | Wright |
| (Continued) | | |

FOREIGN PATENT DOCUMENTS

| | | |
|---|---|---|
| DE | 10334066 A1 | 2/2005 |
| DE | 102011089556 A1 | 6/2013 |
| (Continued) | | |

OTHER PUBLICATIONS

International Search Report dated Aug. 14, 2019 in connection with International Application No. PCT/EP2019/050875.

*Primary Examiner* — Jeffery S Zweizig
(74) *Attorney, Agent, or Firm* — Norton Rose Fulbright US LLP; Gerard Messina (57) ABSTRACT

An electrical circuit for ensuring safe ramp-up and ramp-down of at least a regulated operating voltage, a reference voltage, and a reset signal for a consumer is described. The electrical circuit includes a voltage reference circuit and a voltage regulator. The voltage regulator is provided in order to furnish a regulated operating voltage, the voltage reference circuit is provided in order to be supplied with the regulated operating voltage furnished by the voltage regulator, and the voltage regulator is provided in order to obtain a reference voltage from the voltage reference circuit.

19 Claims, 5 Drawing Sheets

(56) References Cited

U.S. PATENT DOCUMENTS

| | | | |
|---|---|---|---|
| 8,143,872 B2* | 3/2012 | Lipcsei | ............... G05F 1/56 |
| | | | 323/282 |
| 9,857,818 B1 | 1/2018 | Adamski | |
| 9,921,595 B2* | 3/2018 | Nakamoto | ............ G05F 1/575 |
| 10,019,026 B2* | 7/2018 | Ippolito | ............... G05F 3/30 |
| 2004/0217785 A1 | 11/2004 | Colbeck et al. | |
| 2007/0053115 A1 | 3/2007 | Tain et al. | |
| 2008/0186003 A1 | 8/2008 | Cho et al. | |
| 2009/0309562 A1 | 12/2009 | Lipcsei et al. | |
| 2009/0322297 A1 | 12/2009 | Shiota | |
| 2016/0187905 A1 | 6/2016 | Nakamoto | |

FOREIGN PATENT DOCUMENTS

| | | |
|---|---|---|
| JP | H11225052 A | 8/1999 |
| JP | 2000209848 A | 7/2000 |
| JP | 2003216253 A | 7/2003 |
| JP | 2009080541 A | 4/2009 |

* cited by examiner

Fig. 1
Existing Art

ELECTRIC CIRCUIT FOR THE SAFE RAMP-UP AND RAMP-DOWN OF A CONSUMER

FIELD

The present invention relates to an electrical circuit for ensuring safe ramp-up and ramp-down of at least a regulated operating voltage, a reference voltage, and a reset signal for a consumer, encompassing a voltage reference circuit and a voltage regulator.

BACKGROUND INFORMATION

An application-specific integrated circuit (ASIC) must be supplied with voltage in order to perform its function. In order to allow a determination, upon the respective transition between an unpowered, zero-voltage state and a powered state, as to whether the supply voltage of the ASIC is within a specified range, the supply voltage must be monitored so that, if the supply voltage is too low or too high, the ASIC can be brought into a defined safe operating state, for example partial or complete deactivation. It is thereby possible to preclude malfunctioning of the ASIC due to an excessively low or excessively high supply voltage. A reference voltage is generally necessary in order to monitor the supply voltage; voltage monitoring can take place within or outside the ASIC.

In certain application scenarios, in some cases there exists no regulated supply voltage delivered from outside, no reference voltage delivered from outside, and no reset signal delivered from outside which indicates that an external supply voltage that is being made available, and an externally provided reference voltage, have reached their target values. This is the case, for example, in a voltage supply ASIC. The internal operating voltage or voltages must then be generated in the ASIC itself, from a supply voltage that is delivered from outside and may be unregulated. The same applies to the reference voltage, and to the reset signal that indicates that the internally generated reference voltage and the internally generated regulated operating voltages have reached their target values. The reference voltage and reset signal must therefore also be generated in the ASIC itself.

The reference voltage is therefore needed on the one hand in order to adjust or regulate the internal operating voltages of the ASIC to a specific value. On the other hand, the reference voltage is needed in order to monitor the internal operating voltages for undervoltage, and optionally also for overvoltage. Voltage monitoring as a rule is effected using comparators that compare the operating voltages, divided down with voltage dividers, with the reference voltage, and generate corresponding reset signals.

A voltage reference circuit, and the comparators responsible for the reset signals, themselves depend, however, on an internal operating voltage generated in the ASIC. In this constellation, the operating voltages generated in the ASIC depend on the reference voltage, which in turn depends on an operating voltage furnished in the ASIC. Generation of the reset signals for the internal operating voltages, and safe operation of the ASIC associated therewith, depend on the operating voltages and on the reference voltage. This results in reciprocal dependences that require very careful design in order to ensure safe ramp-up and ramp-down of the primary voltage supplies, and thus also safe ramp-up and ramp-down of the entire ASIC.

What is critical here above all is ramp-up and ramp-down, in which the internal voltages must be monitored for undervoltage and overvoltage while they are respectively built up and dissipated, usually within a few micro- or milliseconds. In an operating state of this kind as well, the voltage reference circuit and the comparators must be supplied with an operating voltage in order to perform this function; and they can operate correctly only when the operating voltage is above a specific value. If, in order to achieve a better power supply rejection ratio, the reference voltage is also used to make the operating voltage available for the voltage reference circuit with the aid of a voltage regulator, the voltage regulator and the voltage reference circuit can prevent one another from ramping up, since it is occasionally possible for the voltage reference circuit not to reach its target value and for the voltage regulator then to make available a reference voltage that is too low, to which it then regulates. An excessively low internal operating voltage thus occurs, which in turn permanently prevents the voltage reference circuit from reaching its final target value. A further risk is that the comparators may compare an excessively low operating voltage with an excessively low reference voltage, with the result that either an undervoltage is erroneously not detected or an overvoltage is erroneously signaled, with the result that malfunctions can be caused in other circuit portions of the ASIC.

It is apparent in practice, unfortunately, that problems that occur during the ramp-up and ramp-down of systems are often, because of their complexity, not discovered using a circuit simulator. They often become evident, sometimes only by accident, only when engineering samples of the relevant ASIC are available. A reset signal that assumes the wrong state during ramp-up or ramp-down, or a voltage regulator and a voltage reference circuit that prevent one another from ramping up, are often reasons for redesigning an ASIC.

Safe ramp-up and ramp-down of the primary internal voltage supply and of the primary reference voltage, as well as generation of a primary reset signal which indicates that these two necessary first elements of the ASIC infrastructure are functionally ready, are fundamental in terms of safe ramp-up and ramp-down of an ASIC, since all the further elements of the ASIC infrastructure that are involved in the process of starting up or shutting down (e.g., further operating voltages and pertinent reset signals, voltage references, and current references) can be derived from those primary elements.

According to a conventional approach in the existing art, a voltage reference circuit and the comparators can be supplied with a first unregulated operating voltage that is furnished by way of a Zener diode and a transistor, so that the above-described mutual dependence of reference voltage generation and operating voltage generation is eliminated. It is also possible thereby to prevent a reference voltage which is too low during ramp-up from causing the operating voltage to remain at too low a value, which in turn might cause the reference voltage to remain below the target value. In addition, when an undervoltage comparator is used, it must be ensured that the output signal of the comparator is not evaluated until the reference voltage has reached its target value. This prevents the comparator from erroneously not indicating an undervoltage when the operating voltage is too low and the reference voltage is too low. For that purpose, the signal of the comparator is enabled by an AND gate only when a power-on reset circuit has identified a voltage that is high enough for operation of the voltage reference circuit and of the comparator.

According to the existing art, power-on reset circuits based on the bandgap principle are used; these signal when the ramping-up or ramping-down unregulated first internal operating voltage exceeds or falls below a specific target value. With the aid of this power-on reset threshold, a conclusion can be reached as to whether the available unregulated operating voltage is sufficient to operate the voltage reference circuit and the comparator, which can then reach an exact conclusion as to whether the regulated internal operating voltage is above the undervoltage reset threshold.

Because the unregulated operating voltage is temperature-dependent, and the temperature response generally does not correlate with the temperature response of the bandgap, in an implementation according to the existing art either the temperature response of each individual component in the series would need to be trimmed, or a certain greater inaccuracy in the reference voltage would need to be taken into consideration. The unregulated voltage is furthermore dependent on the load current. A further result of the unregulated operating voltage, in addition to the temperature response, is an additive inaccuracy in the reference voltage, since the voltage reference circuit has a finite power supply rejection ratio (PSRR). What is more, the Zener diode that is used must have a current of, as a rule, several µA flowing through it so that the diode is operated in that portion of its characteristic curve in which the Zener voltage changes only slightly upon a variation in the current. In the case of an ASIC operating in standby mode, this additional power consumption can have disruptive effects on the Zener diode and the power-on reset circuit.

SUMMARY

The present invention provide an electrical circuit for ensuring safe ramp-up and ramp-down of at least a regulated operating voltage, a reference voltage, and a reset signal for a consumer, which circuit encompasses a voltage reference circuit and a voltage regulator. In accordance with an example embodiment of the present invention, the voltage regulator is provided in order to furnish a regulated operating voltage, the voltage reference circuit is provided in order to be supplied with the regulated operating voltage furnished by the voltage regulator, and the voltage regulator is provided in order to obtain a reference voltage from the voltage reference circuit.

The circuit according to an example embodiment of the present invention has the advantage that a higher power supply rejection ratio can be achieved by the fact that the voltage reference circuit is supplied with a regulated operating voltage that is furnished by a voltage regulator, which in turn obtains its reference voltage from the voltage reference circuit that it is supplying. The present invention nevertheless ensures that the voltage regulator and the voltage reference circuit cannot prevent one another from ramping up.

The example circuit according to the present invention furthermore makes it possible, in the interest of lower power consumption, to eliminate an unregulated additional operating voltage that is to be supplied to comparators and to the voltage reference circuit.

In addition, the reset signal of comparators that are used is evaluated only when the operating voltage is sufficiently high that the comparators and the voltage reference circuit can safely operate.

In addition, according to the present invention a separate power-on reset circuit can be omitted in the interest of a lower power consumption.

According to an example embodiment of the present invention, the voltage regulator is prevented from regulating to a lower voltage value than the voltage value that is required in order to ramp up the voltage reference circuit and allow it to reach its target value. This is ensured even when the reference voltage of the voltage reference circuit during ramp-up happens to assume too low a value, which would actually result in too low an operating voltage for the voltage regulator, which in turn would prevent the voltage reference circuit from continuing to ramp up.

Only if the operating voltage furnished by the voltage regulator is sufficient for the voltage reference circuit to reach its target value, and if there is assurance that the comparators can operate safely, will the operating voltage made available by the voltage regulator be regulated to its setpoint in accordance with the reference voltage predefined by the voltage reference circuit, and only then will the reset signal of the comparators also be evaluated or enabled.

In a particular embodiment of the present invention, provision is made that the electrical circuit further encompasses a comparator that is provided in order to compare the regulated operating voltage and the reference voltage. The electrical circuit preferably further encompasses an AND gate that is provided in order to evaluate an output signal of the comparator and a signal, outputted by the voltage reference circuit, which indicates whether the operating voltage is high enough to make the reference voltage available, and in order to output the reset signal. This makes it possible for not only a regulated operating voltage and a reference voltage, but also a reset signal that is generated in consideration of the regulated operating voltage and reference voltage, to be outputtable by the electrical circuit according to the present invention.

Provision is furthermore advantageously made that a timing element is provided in order to delay a trailing edge of the signal outputted by the voltage reference circuit. This has the advantage that a defined power-on reset phase can be implemented even in a context of smaller, shorter interruptions in the operating voltage.

According to a further advantageous embodiment of the present invention, the voltage reference circuit encompasses a current mirror. This makes it possible to adjust, for bipolar transistors used in the voltage reference circuit, a working point at which both their base voltage and their collector currents are identical.

Advantageously, provision is further made that the voltage regulator also encompasses a current mirror. This has the advantage that during ramp-up, the gate of an output transistor of the voltage regulator can initially be raised to the value of the external operating voltage, as long as the latter exceeds the target value of the internal operating voltage by an amount no greater than the threshold voltage of the output transistor.

The internal operating voltage can thereby track the external operating voltage during ramp-up.

According to a preferred embodiment of the present invention, provision is furthermore made that the voltage regulator encompasses a differential amplifier. By way of the output of the differential amplifier, the gate of the output transistor is adjusted via the power stage in such a way that the target value of the internal operating voltage is produced, and the input difference voltage between the gates of the transistors of the difference pair of the differential amplifier becomes 0 volt.

In a further preferred example embodiment of the electrical circuit according to the present invention, the differential amplifier of the voltage regulator has a second and a third positive input which are provided in order to deliver a second and a third command variable, in addition to the reference voltage, in order to set a lower limit for the operating voltage. This has the advantage that the internal operating voltage can thereby come very close to the external supply voltage.

Advantageous refinements of the present invention are described herein.

BRIEF DESCRIPTION OF THE DRAWINGS

Exemplifying embodiments of the present invention are explained in further detail in the description below with reference to the figures.

DETAILED DESCRIPTION OF EXAMPLE EMBODIMENTS

Below, voltages (with reference to ground) at terminals and networks are labeled, for example, respectively as $U_{VSUP}$ for the $V_{SUP}$ terminal and $U_{VBU}$ for the network $V_{BU}$, or alternatively labeled as $U_{VSUP}(t)$ and $U_{VSU}(t)$ if the time dependence is to be emphasized for better comprehension. Even without explicit emphasis, however, the time dependence always generally exists.

Figure 1:
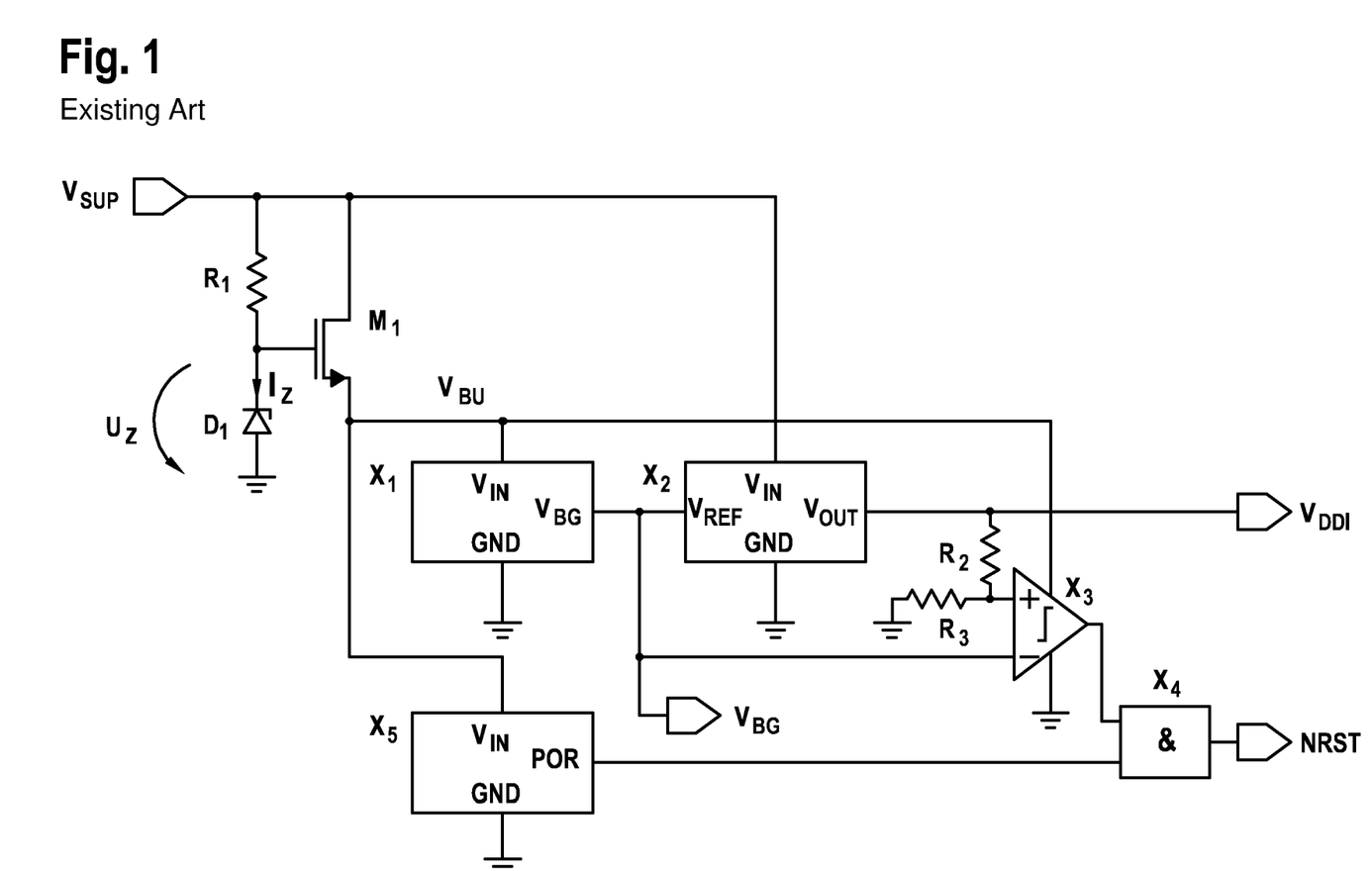
FIG. 1 shows a conventional circuit from the existing art, for furnishing a primary operating voltage, a reference voltage, and a reset signal.

FIG. 1 shows a conventional circuit from the existing art, for furnishing a primary operating voltage, a reference voltage, and a reset signal, in which a voltage reference circuit $X_1$ and the comparators (only an undervoltage comparator $X_3$ being illustrated in the interest of simplicity) are supplied with a first unregulated operating voltage $U_{VBU}$, so that mutual dependence between reference voltage generation and operating voltage generation can be eliminated. It is thereby possible to prevent an excessively low reference voltage $U_{VBG}$ during ramp-up from causing the operating voltage to remain at too low a value, which in turn could cause the reference voltage $U_{VBG}$ to remain below a target value.

As depicted in FIG. 1, the first unregulated operating voltage $U_{VBU}$ can be furnished by transistor $M_1$ using a Zener diode $D_1$ through which a current $I_Z$ flows. The current $I_Z$ is determined by resistor $R_1$, supply voltage $U_{VSUP}$, and the Zener voltage $U_Z$ of Zener diode $D_1$. The voltage $U_{VBU}$ is approximately in the vicinity of the threshold voltage of transistor $M_1$ below the Zener voltage $U_Z$.

In order to prevent comparator $X_3$ from erroneously not indicating an undervoltage if an operating voltage $U_{VBU}$ is too low and a reference voltage $U_{VBG}$ is too low, it is necessary to ensure that the output signal of comparator $X_3$ is not evaluated until the reference voltage $U_{VBG}$ has reached its target value. For that purpose, the signal of comparator $X_3$ is not enabled by AND gate $X_4$ until power-on reset circuit $X_5$ has identified a voltage $U_{VBU}$ that is sufficiently high for the operation of voltage reference circuit $X_1$ and of comparator $X_3$.

According to the existing art, power-on reset circuits exist which are based on the bandgap principle, and which signal more or less accurately when the ramping-up or ramping-down unregulated first internal operating voltage $U_{VBU}$ respectively exceeds or falls below a specific target value. This power-on reset threshold can allow a conclusion as to whether the available unregulated operating voltage is sufficient to operate voltage reference circuit $X_1$ and comparator $X_3$, which can then arrive at an exact conclusion as to whether the regulated internal operating voltage $U_{VDDI}$ is above the undervoltage reset threshold.

The unregulated operating voltage $U_{VBU}$ is temperature-dependent; as a rule, the temperature response does not correlate with the temperature response of the bandgap, so that the temperature response of each individual component in the series would need to be trimmed or, alternatively, a certain greater inaccuracy in reference voltage $U_{VBG}$ would need to be considered. The unregulated voltage $U_{VBU}$ is furthermore dependent on the load current. Because the voltage reference circuit $X_1$ has a finite power supply rejection ratio (PSRR), what results because of the unregulated operating voltage $U_{VBU}$, in addition to the temperature response, is an additive inaccuracy in the reference voltage $U_{VBG}$.

Zener diode $D_1$ must have a current $I_D$ flowing through it so that it can be operated in that part of its characteristic curve $U_Z(I_D)$ in which the Zener voltage $U_Z$ changes only slightly upon a change in the current $I_D$. That current is, as a rule, in the range of a few µA. In the context of an ASIC operating in standby mode, the additional power consumption for the Zener diode and the power-on reset circuit can have a disruptive effect.

Figure 2:
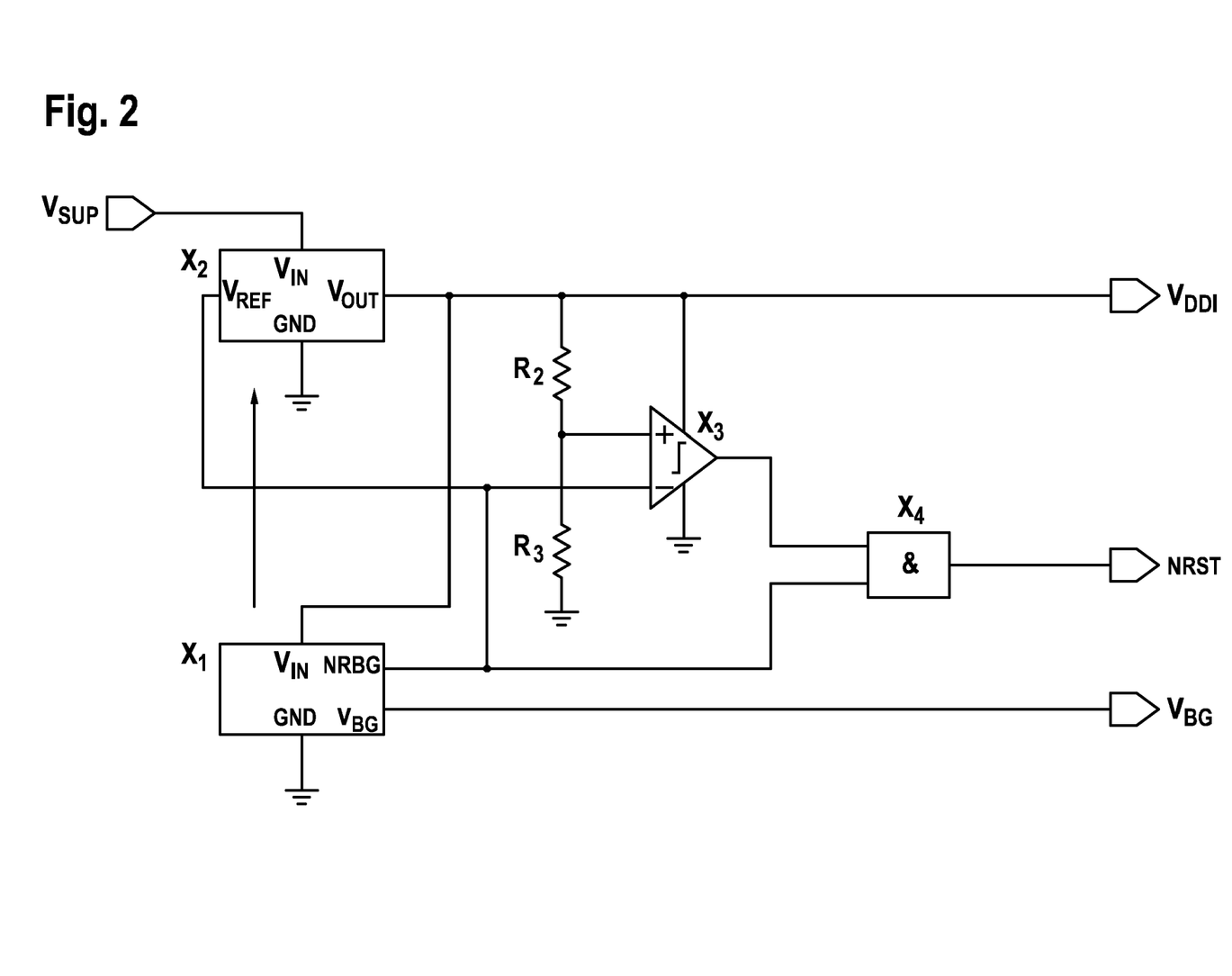
FIG. 2 shows an exemplifying embodiment of a circuit according to the present invention for furnishing a primary operating voltage, a reference voltage, and a reset signal.

FIG. 2 shows an exemplifying embodiment of a circuit according to the present invention for furnishing a primary operating voltage $U_{VDDI}$, a reference voltage $U_{VBG}$, and an undervoltage reset signal NRST. Voltage regulator $X_2$ is supplied with supply voltage $U_{VSUP}$, and obtains its reference voltage $U_{VBG}$ from voltage reference circuit $X_1$, which is turn is supplied with primary operating voltage $U_{VDDI}$. Voltage reference circuit $X_1$ indicates for that purpose, by way of its signal NRBG, whether the supply voltage $U_{VDDI}$ is high enough to make reference voltage $U_{VBG}$ available and to operate undervoltage comparator $X_3$. Voltage regulator $X_2$ is prevented from regulating to a lower voltage value $U_{VDDI}$ than the one needed in order to allow voltage reference circuit $X_1$ to ramp up and to reach its target value. Analog control signals of voltage reference circuit $X_1$ are evaluated for that purpose by voltage regulator $X_2$, as indicated by the arrow proceeding from voltage reference circuit $X_1$ to voltage regulator $X_2$.

Figure 3:
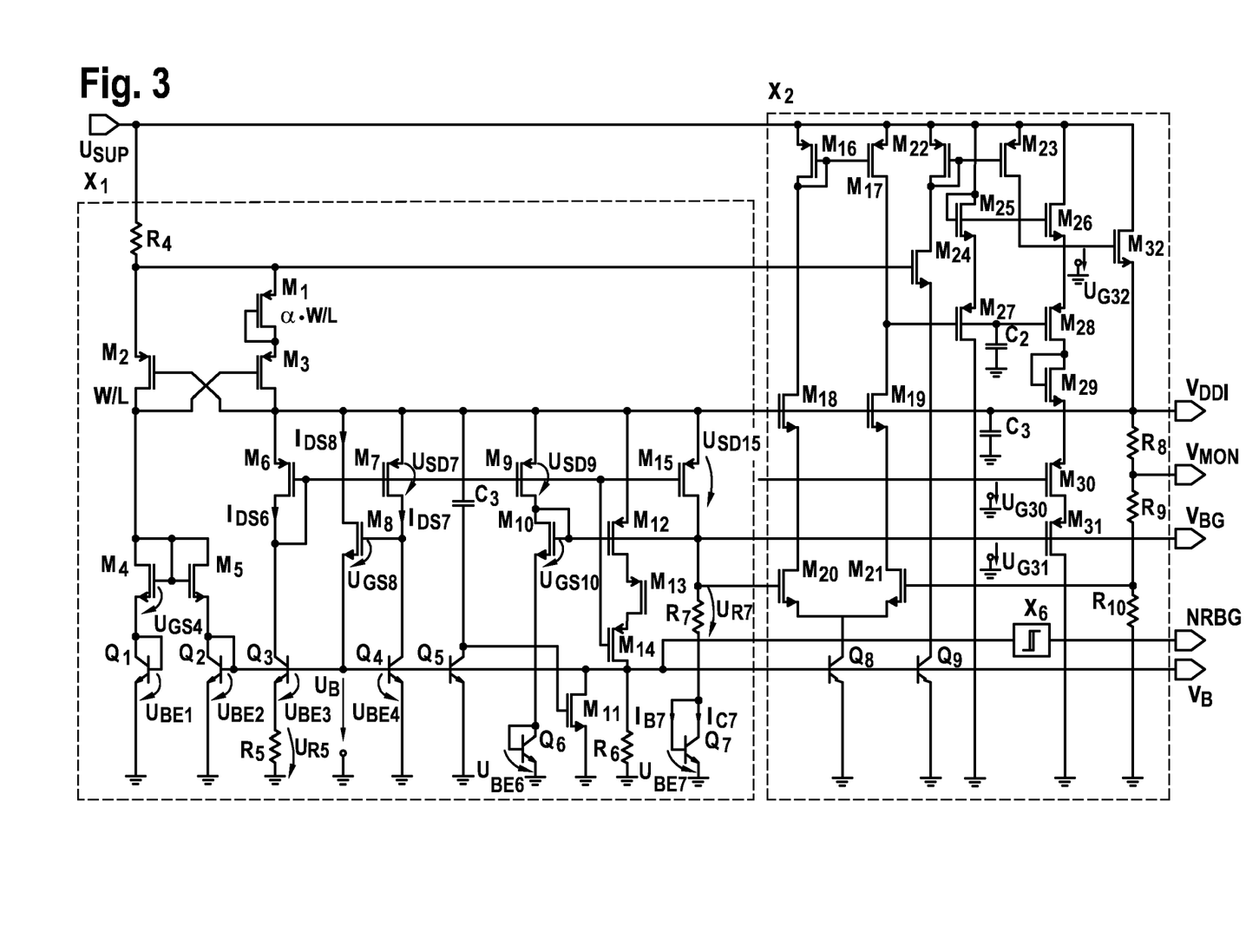
FIG. 3 shows an exemplifying embodiment of a voltage reference circuit usable according to the present invention, and of a voltage regulator usable according to the present invention.

FIG. 3 shows an exemplifying embodiment of a voltage reference circuit usable according to the present invention, and of a voltage regulator usable according to the present invention, in their circuit-engineering implementation. Voltage regulator $X_2$ is embodied to generate an operating voltage $U_{VDDI}$ from an unregulated voltage $U_{VSUP}$, and is further embodied, together with a voltage reference circuit $X_1$, to generate a reference voltage $U_{VBG}$ that can ensure safe ramp-up and ramp-down of the primary voltage supplies and of the reference voltage of an ASIC. In addition, the reset signal NRBG indicates whether the supply voltage $U_{VDDI}$ is high enough to make the reference voltage $U_{VBG}$ available and to operate an undervoltage comparator $X_3$ (not depicted). The left part of FIG. 3 depicts voltage reference circuit $X_1$, made up of components $C_1$, $M_1$ to $M_{15}$, $Q_1$ to $Q_7$, and $R_4$ to $R_7$. Voltage regulator $X_2$, made up of components $C_2$, $C_3$, $M_{16}$ to $M_{32}$, $Q_8$, $Q_9$, and $R_8$ to $R_{10}$, is depicted on the right side of the image.

Voltage reference circuit $X_1$, depicted on the left in FIG. 3, operates according to the known bandgap principle. The two bipolar transistors $Q_3$ and $Q_4$ have different current/voltage characteristic curves $I_{C3}$ ($U_B$) and $I_{C4}$ ($U_B$) because of their different sizes ($Q_3$ is larger than $Q_4$ by a factor n) and because of the current feedback of $Q_3$ produced by resistor $R_5$. The current mirror made up of $M_6$ and $M_7$ adjusts, for the two bipolar transistors $Q_3$ and $Q_4$, the working point at which both their base voltage $U_B$ and their collector currents $I_{C3}$ and $I_{C4}$ are identical. The base voltage $U_B$ of $Q_3$ and $Q_4$ is regulated by $M_8$ for that purpose. If the base voltage $U_B$ is too low, the collector current $I_{C3}$ of $Q_3$ is then higher than that of $Q_4$ because of its area which is larger by the factor n, so that the gate of $M_8$ is pulled upward by transistor $M_7$ and the base voltage $U_B$ rises further. If the base voltage $U_B$ is too high, the collector current $I_{C3}$ is lower than that of $Q_4$ because of the current feedback of $Q_3$ produced by resistor $R_5$, so that the gate of $M_8$ is pulled downward by bipolar transistor $Q_4$ and the base voltage $U_B$ decreases further. The base-emitter voltage $U_{BE3}$ of $Q_3$ is lower, by $\Delta U_{BE}=kT/q \times \ln(n)$, than the base-emitter voltage $U_{BE4}$ of $Q_4$, where k is the Boltzmann constant, T the absolute temperature, q the charge of an electron, and n the size ratio between $Q_3$ and $Q_4$. The voltage difference $\Delta U_{SE}$, together with the selection of resistor $R_5$, defines the respective collector currents $I_{C3}$ of $Q_3$ and $I_{C4}$ of $Q_4$ and the respective drain-source currents $I_{DS6}$ of $M_6$ and $I_{DS7}$ of $M_7$, where $I_{C3}=I_{C4}=I_{DS6}=I_{DS7}=I_{PTAT}=1/R_2 \times kT/q \times \ln(n)$. The current $I_{PTAT}$ is proportional to absolute temperature (PTAT), with a positive temperature coefficient. At the same time, however, the base-emitter voltage of bipolar transistors $Q_3$ and $Q_4$, and the base voltage $U_B$, are also highly temperature-dependent. They have a negative temperature coefficient. The temperature profiles of both the base-emitter voltages and the collector currents are almost linear.

$M_{15}$ causes the current $I_{PTAT}$ also to flow through $R_4$ and through $Q_7$, where $I_{R4}=I_{C7}=I_{PTAT}$ ($I_{B7}$ being ignored). Because $Q_4$ and $Q_7$ are identical in nature, then because $I_{C4}=I_{C7}$ (and ignoring $I_{B7}$), they also have the same base-emitter voltage $U_{BE4}=U_{BE7}=U_8$. A resistor $R_7$ can be found for which the sum of the voltage drop $U_{R7}$ across $R_7$, caused by the collector current $I_{C7}=I_{PTAT}$ flowing through it, and the base-emitter voltage $U_{BE7}$, are independent of temperature to a first approximation. The total voltage $U_{BE7}+U_{R7}$ is also referred to as a "bandgap" voltage. It is equal to approximately 1.25 V regardless of the semiconductor technology that is used. This bandgap voltage reference circuit $X_1$ requires a startup circuit, since the condition $I_{C3}=I_{C4}$ is also met for a current of 0.

Voltage regulator $X_2$ shown on the right in FIG. 3 is made up of a differential amplifier constituted by transistors $M_{16}$ to $M_{21}$ and an output stage in AB mode, constituted by way of transistors $M_{25}$ to $M_{28}$, for application of control to an output transistor $M_{32}$. The differential amplifier obtains its cross current from transistor $Q_8$, whose base is connected to that of $Q_2$ and which thus functions as a current source. The current $I_{PTAT}$ of the voltage reference circuit therefore also flows through the difference pair made up of transistors $M_{20}$ and $M_{21}$. The gate of transistor $M_{20}$ is connected to the reference voltage $V_{BG}$. The gate of transistor $M_{21}$ is connected to the internal operating voltage $U_{VDDI}$ divided down via the voltage divider made up of resistors $R_8$ to $R_{10}$, so that the output of the differential amplifier adjusts the gate of output transistor $M_{32}$, by way of the output stage, in such a way that the target value of the internal operating voltage (for example, a target value of 2.5 to 5 volts) is produced, and the input difference voltage between the gates of transistors $M_{20}$ and $M_{21}$ becomes 0 V.

Cascode transistors $M_{18}$ and $M_{19}$ can preferably be embodied as high-voltage transistors in order to enable higher input voltages, corresponding to the voltage class of those transistors, at the $V_{SUP}$ terminal. For the same reason, transistors $M_{16}$ and $M_{17}$ of the differential amplifier current mirror can preferably also be embodied as high-voltage transistors. The use of cascode transistors to increase the differential gain and the power supply rejection ratio would also be advantageous for this current mirror. In the interest of simplicity, however, cascode transistors are omitted at all points in FIG. 3 at which they are not necessary.

The AB output stage made up of transistors $M_{25}$ to $M_{28}$ is connected to the gate of $M_{27}$ at the differential amplifier output. It controls the gate of output transistor $M_{32}$ of the voltage regulator. The transistors of the output stage, and the output transistor, can preferably be embodied as high-voltage transistors in order to enable higher input voltages at the $V_{SUP}$ terminal. Capacitor $C_2$ can serve for frequency response compensation. Capacitor $C_3$ can be used as a support capacitor or load capacitor for the voltage regulator.

Startup of voltage reference circuit $X_1$ and of voltage regulator $X_2$ requires a startup circuit. As soon as the externally delivered unregulated operating voltage $U_{VSUP(t)}$ is high enough (in the present case, approximately 1 volt), the current $I_{DS4(t)}$ begins to flow through resistor $R_4$ and transistors $M_2$, $M_4$, and $Q_1$. Transistor $M_2$ conducts because the voltage $U_{VDDI(t)}$ at its gate is initially 0 V. Assuming that $M_4$ and $M_5$ are identical in nature and that $Q_1$ and $Q_2$ are identical in nature, and ignoring the base currents of $Q_2$ to $Q_5$ and of $Q_8$ and $Q_9$, the same current also flows through transistors $M_5$ and $Q_2$, so that therefore $I_{DS4(t)}=I_{DS5(t)}$. Because the base of $Q_9$ is connected to the base of $Q_2$, this current also flows via transistors $Q_9$ and $M_{24}$ into the current mirror constituted from $M_{22}$ and $M_{23}$, which raises the gate of $M_{32}$ during ramp-up firstly to the value of the external operating voltage $U_{VSUP(t)}$, as long as the latter does not exceed the target value of the internal operating voltage by more than the threshold voltage of $M_{32}$. Transistor $M_{24}$ conducts because its gate is raised via resistor $R_4$ to the sum of the base-emitter voltage $U_{BE(t)}$ of $Q_1$ and the gate-source voltage $U_{GS4(t)}$ of $M_4$. During ramp-up, the internal operating voltage $U_{VDDI(t)}$ (decreased by an amount equal to the threshold voltage of $M_{32}$ and starting from 0 V) therefore initially tracks the external operating voltage $U_{VSUP(t)}$.

Because the base of $Q_8$ is also connected to the base of $Q_2$, $Q_9$ also begins to carry the same collector current as $Q_2$ as soon as one of the transistors of the difference pair made up of $M_{20}$ and $M_{21}$ begins to conduct, and the internal operating voltage $U_{VDDI(t)}$ is already sufficiently high that the current mirror made up of $M_{16}$ and $M_{17}$ begins to function. The gates of transistors $M_{20}$ and $M_{21}$, constituting inputs of the difference pair, are connected on the one hand to the ramping-up reference voltage $U_{VBG(t)}$, and on the other hand to the ramping-up internal operating voltage $U_{VDDI(t)}$ that has been divided down via the voltage divider made up of resistors $R_5$ to $R_7$. The internal operating voltage is too low as ramp-up begins, however, so that the target value of the reference voltage $V_{BG}$ cannot at first occur, and the divided-down internal operating voltage also has not yet reached its target value. During ramp-up it is therefore not possible to predetermine which of these two voltages is higher as the ramp-up proceeds over time, or to predict the voltage profile over time that will occur at the output of the differential amplifier. Without further actions, the risk would exist that the voltage reference circuit might generate too low a reference voltage $V_{BG}$ and that the latter might remain at its excessively low value, since the ramping-up internal operating voltage might in fact not make possible a higher reference voltage. The result of this would be that the operating voltage would be unable to rise further and would never reach its target value, since from this perspective the differential amplifier would regulate to the excessively low value of the reference voltage.

In the present case the reference voltage $U_{VBG(t)}$ is the sum of the base-emitter voltage $U_{BE7(t)}$ of transistor $Q_7$ and the voltage drop $U_{R7(t)}$ across resistor $R_7$. As long as the internal operating voltage is so low that the reference voltage has not yet reached its target value, $U_{VDDI(t)}$ must be higher, as the ramp-up proceeds over time, than the current value of the base-emitter voltage $U_{BE7(t)}$ of transistor $Q_7$ plus the present value of the voltage drop $U_{R7(t)}$ across resistor $R_7$ and the present value of the drain-source saturation voltage $U_{DS15.sat(t)}$ of transistor $M_{15}$ functioning as a current source, yielding the following correlation:

$$U_{VDDI(t)} > U_{BE7(t)} + U_{R7(t)} + U_{D15.sat(t)} \quad (1)$$

As long as the internal operating voltage is not sufficient to allow the reference voltage of the voltage reference circuit to reach the target value, the base voltage $U_{B(t)}$ is also too low, and the gate of transistor $M_8$ is pulled upward because of the above-described regulating behavior of voltage reference circuit $X_1$. In order for the reference voltage to be able to ramp up safely, in addition to the aforementioned condition (1) there must also be assurance that the internal operating voltage $U_{VDDI(t)}$ makes possible a further rise in the gate voltage of $M_8$ during ramp-up. It follows from this that as the ramp-up proceeds over time, $U_{VDDI(t)}$ must be higher than the present value of the base voltage $U_{B(t)}$ plus the present value of the gate-source voltage $U_{GS8(t)}$ of transistor $Q_8$ and the present value of the drain-source saturation voltage $U_{DS7.sat(t)}$ of transistor $M_7$ that functions as a current source, so that:

$$U_{VDDI(t)} > U_{B(t)} + U_{GS8(t)} + U_{DS7.sat(t)} \quad (2)$$

In order to prevent the two ramping-up input voltages of the differential amplifier, namely the reference voltage $U_{VBG(t)}$ and the divided-down internal operating voltage $U_{VDDI(t)}$, from causing the differential amplifier to undesirably pull the gate of output transistor $M_{32}$ downward during ramp-up, the voltage value to which the AB output stage can pull the gate of $M_{32}$ is limited at the low end with the aid of transistors $M_{29}$ to $M_{31}$, so that the aforementioned inequalities (1) and (2) are always satisfied. The AB output stage can pull the gate of $M_{32}$ downward only as long as transistors $M_{28}$ to $M_{31}$ are conducting. The source terminal of transistor $M_{29}$ is thus always higher, by an amount equal to the respective threshold voltage $U_{TH30}$ or $U_{TH31}$ of transistors $M_{30}$ or $M_{31}$, than the higher of the two respective gate voltages $U_{G30(t)}$ or $U_{G31(t)}$ of $M_{30}$ or $M_{31}$. The gate of output transistor $M_{32}$ can correspondingly be no lower than the sum of the threshold voltage $U_{TH29}$ of $M_{29}$, the respective threshold voltage $U_{TH30}$ or $U_{TH31}$ of $M_{30}$ or $M_{31}$, and the higher of the two respective gate voltages $U_{G30(t)}$ or $U_{G31(t)}$ of $M_{30}$ or $M_{31}$, so that $U_{G32(t)} \geq U_{TH29} + \max(U_{G30(t)} + U_{TH30}; U_{G31(t)} + U_{TH31})$. This yields a lower limit to which the voltage regulator can regulate the internal operating voltage. On the assumption that the threshold voltages of transistors $M_{29}$ and $M_{30}$ and those of transistors $M_{30}$ and $M_{31}$ are approximately the same, they are higher, by an amount approximately equal to the threshold voltage $U_{THP}$ of a PMOS transistor, than the higher of the two respective gate voltages $U_{G30(t)}$ or $U_{G31(t)}$ of $M_{30}$ or $M_{31}$, so that:

$$U_{VDDI(t)} U_{G30(t)} + U_{THP} \quad (3)$$

and $$U_{VDDI(t)} > U_{G31(t)} + U_{THP}. \quad (4)$$

The voltage $U_{G31(t)}$ is the sum of $U_{BE7(t)}$ and $U_{R7(t)}$. With suitable dimensioning, the threshold voltage $U_{THP}$ of $M_{31}$ is higher than the drain-source saturation voltage $U_{DS15.sat(t)}$ of $M_{15}$. Inequality (1) is thus always satisfied.

The voltage $U_{G30(t)}$ is the sum of $U_{BE6(t)}$ and $U_{GS10(t)}$. Assuming that $M_8$ and $M_{10}$, and $Q_2$ and $Q_6$, are identical in nature, and ignoring the base currents of $Q_2$ to $Q_5$, $Q_8$, and $Q_9$ and the current $I_{DS5}$, $Q_6$ and $M_{10}$ have the same current $I_{PTAT}$ flowing through them as $M_8$ and $Q_2$, so that $U_{G30(t)}$ corresponds to the sum of $U_{GS8(t)} + U_{B(t)}$. With suitable dimensioning, it is permissible to ignore $I_{DS5}$ if $I_{DS5} \ll I_{PTAT}$ over the entire temperature range. The base voltage $U_{B(t)}$ is equal to the base-emitter voltage $U_{BE2(t)}$ of $Q_2$, whose collector receives the current from $M_8$. With suitable dimensioning, the threshold voltage $U_{THP}$ of $M_{30}$ is higher than the drain-source saturation voltage $U_{DS7.sat(t)}$ of $M_7$. Inequality (2) is thus always satisfied. Satisfaction of inequalities (1) and (2) ensures that voltage reference circuit $X_1$ can always ramp up.

With suitable dimensioning of transistors $M_1$ to $M_3$ it is possible to ensure that the current that flows via resistor $R_4$ out of the $V_{SUP}$ terminal is not completely dissipated to GND via transistors $M_2$, $M_4$, $M_5$, $Q_1$, and $Q_2$, but instead partly feeds the internal operating voltage as soon as ramp-up has progressed sufficiently and the internal operating voltage $U_{VDDI(t)}$ has reached approximately the value $U_{GS4(t)} + U_{BE(t)}$, since $M_3$ then begins to conduct and $M_2$ begins to block. The ratio of the currents through $M_2$ and $M_3$ can be adjusted with the aid of the coefficient $\alpha$. This is beneficial especially in terms of a low standby current consumption.

The internal operating voltage $U_{VDDI}$ can be monitored for under- and overvoltage. For that purpose, the operating voltage divided down with a voltage divider can be compared, with the aid of comparators, with the reference voltage in order to generate corresponding under- and overvoltage reset signals. To prevent the comparators from generating erroneous reset signals if the operating voltage $U_{VDDI}$ or reference voltage $U_{VBG}$ is too low, it is necessary to ensure that, during ramp-up and ramp-down and in normal operation, the output signals of the comparators are evaluated only if the internal operating voltage $U_{VDDI}$ is high enough to enable the functionality of the comparators and so that the reference voltage $U_{VBG}$ reaches its target value. The voltage reference circuit generates, for that purpose, a first reset signal NRBG that assumes a logical HIGH level if those two conditions are met and assumes a logical LOW level if one of the two conditions is not met.

If the internal operating voltage $U_{VDDI(t)}$ during ramp-up or ramp-down is so low that the reference voltage $U_{VBG(t)}$ cannot reach its target value, at least one of transistors $M_7$ or $M_{15}$ acting respectively as a current source then respectively pulls the gate of $M_8$ or the top terminal of resistor $R_7$ very close to the operating voltage $U_{VDDI(t)}$, so that at least one of the two source-drain voltages $U_{SD7(t)}$ or $U_{SD15(t)}$ is almost 0 V. Which of the two source-drain voltages is lower depends, inter alia, on the threshold voltage of transistor $M_8$.

Only when the reference voltage $U_{VBG(t)}$ reaches its target value do the two transistor current sources $M_7$ and $M_{15}$ operate in saturation, so that there occurs in both of them a respective positive source-drain voltage $U_{SD7(t)}$ and $U_{SD15(t)}$ that is higher than the respective source-drain saturation voltages $U_{SD7.sat(t)}$ and $U_{SD15.sat(t)}$.

Assuming that $M_8$ and $M_{10}$, and $Q_2$ and $Q_6$, are identical in nature, and ignoring the base currents of $Q_2$ to $Q_5$, $Q_8$, and $Q_9$ and the current $I_{DS5}$, the same current $I_{PTAT}$ flows through $Q_6$ and $M_{10}$ as through $M_8$ and $Q_2$, so that the source-drain voltage $U_{SD9(t)}$ of $M_9$ corresponds to the source-drain voltage $U_{SD7(t)}$ of $M_7$.

If the two source-drain voltages $U_{SD9(t)}$ and $U_{SD15(t)}$ of transistors $M_9$ and $M_{15}$ are higher than the threshold voltages $U_{THP}$ of the two transistors $M_{12}$ and $M_{13}$ (and, given suitable dimensioning, are therefore also higher than the respective source-drain saturation voltages $U_{SD9.sat(t)}$ and $U_{SD15.sat(t)}$), they become conductive, and transistor $M_{14}$, because its gate is connected to that of transistor $M_6$, can provide, in its functionality as a current source, the current $I_{PTAT}$ that, with corresponding dimensioning of resistor $R_6$, can cause the input of Schmitt trigger $X_6$ to be pulled toward operating voltage $U_{VDDI(t)}$ so that there occurs at its output NRBG a HIGH level which indicates that the internal operating voltage $U_{VDDI(t)}$ is high enough for reference voltage $U_{VBG(t)}$ to reach its target value.

The internal operating voltage $U_{VDDI}$ is then higher than the sum of the threshold voltage $U_{TH12}$ of transistor $M_{12}$, the gate-source voltage $U_{GS10}$ of transistor $M_{10}$, and the base-emitter voltage $U_{BE6}$ of transistor $Q_6$, i.e., in general higher than the sum of the threshold voltage $U_{THP}$ of a PMOS transistor, the threshold voltage $U_{THN}$ of an NMOS transistor, and the base-emitter voltage $U_{BE}$ of a bipolar transistor, yielding:

$$U_{VDDI} > U_{THP} + U_{THN} + U_{BE}, \text{when NRBG}=1 \quad (5)$$

In order to hold the input of Schmitt trigger $X_6$, in the context of an abrupt rise in the internal operating voltage $U_{VDDI}$, safely below its switching threshold for a signal change at the output from a LOW level to a HIGH level, capacitor $C_1$ can pull the gate of $M_{11}$ upward so that a dynamic source-drain current of transistor $M_{14}$ can be dissipated via transistor $M_{11}$ and, with suitable dimensioning, an undesired HIGH level at the output of Schmitt trigger $X_6$ can be prevented.

Figure 4:
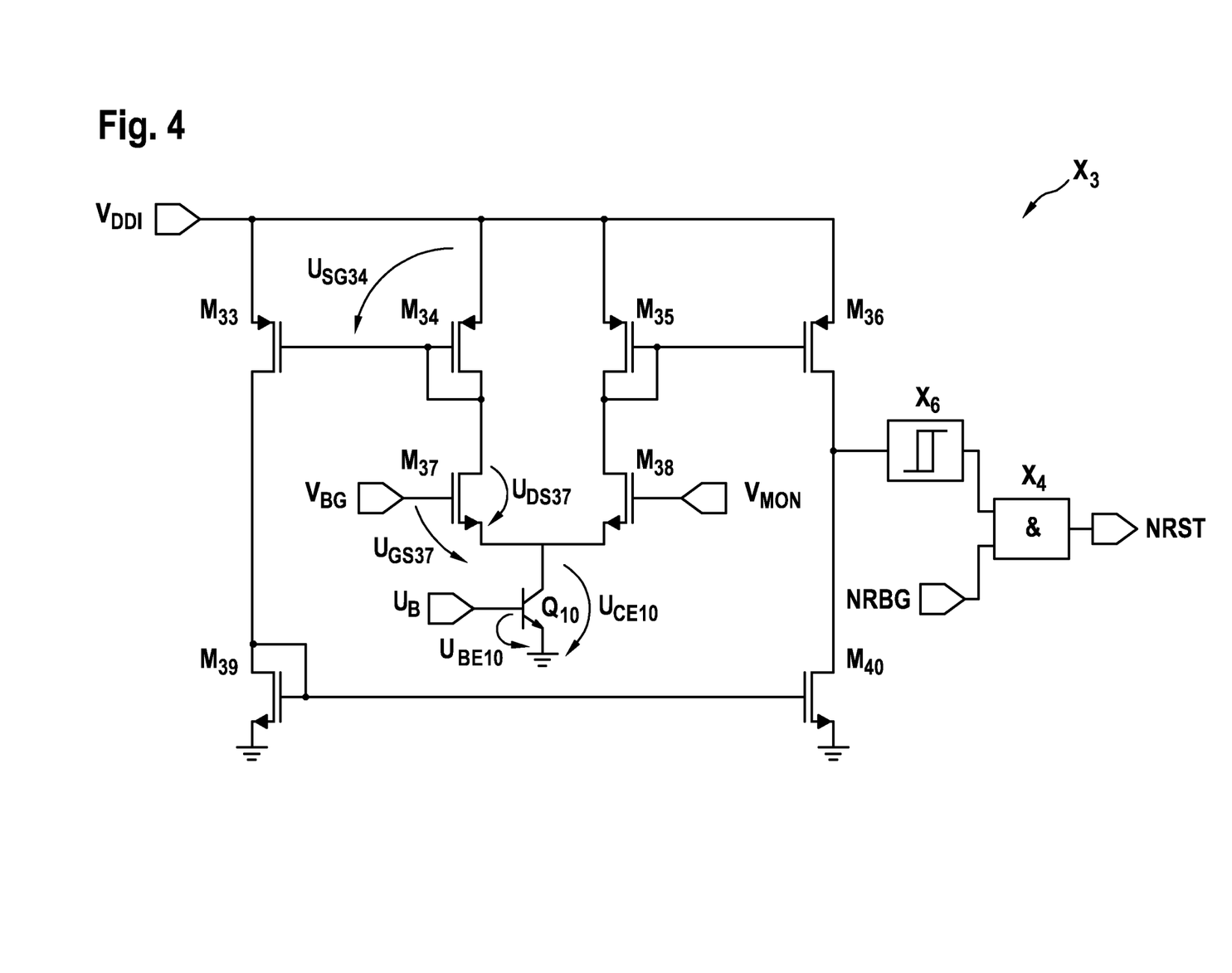
FIG. 4 shows an exemplifying embodiment of a symmetrical comparator, usable according to the present invention, for voltage monitoring.

FIG. 4 shows an exemplifying embodiment of a symmetrical comparator $X_3$, usable according to the present invention, for voltage monitoring, which is connected to a Schmitt trigger $X_6$ that is connected in turn upstream from an AND gate $X_4$. In order for such a comparator to be able to function, the internal operating value $U_{VDDI}$ must be at least equal to the sum of the threshold voltage $U_{TH34}$ of transistor $M_{34}$, the drain-source saturation voltage $U_{DS37.sat}$ of transistor $M_{37}$, and the saturation voltage $U_{CE10.sat}$ of bipolar transistor $Q_{10}$, i.e., in general greater than the sum of a threshold voltage $U_{THP}$ of a PMOS transistor, the drain-source saturation voltage $U_{DSN.sat}$ of an NMOS transistor, and the saturation voltage $U_{CE.sat}$ of a bipolar transistor, yielding the following correlation:

$$U_{VDDI} > U_{THP} + U_{DSN.sat} + U_{CE.sat} \quad (6)$$

On the assumption that the drain-source saturation voltage $U_{DS.sat}$ of a MOS transistor is generally lower than its threshold voltage $U_{TH}$, i.e., $U_{DSN.sat} < U_{THN}$; and that the saturation voltage $U_{CE.sat}$ of a bipolar transistor is lower than its base-emitter voltage $U_{BE}$, i.e., $U_{CE.sat} < U_{BE}$, inequality (6) above is always satisfied for NRBG=1, and the functionality of the symmetrical comparator in FIG. 4 is thereby ensured.

It should be noted that this consideration is valid only if the components $M_{34}$, $M_{35}$, $M_{37}$, $M_{38}$, and $Q_{10}$ of the symmetrical comparator in FIG. 4 have, flowing through them, a current that is lower than or equal to the current that flows through the components $M_{12}$, $M_{10}$, and $Q_6$ of voltage reference circuit $X_1$ in FIG. 3. This is the case for symmetrical comparator $X_3$ of FIG. 4, since transistor $Q_{10}$ of that comparator has flowing through it the same current $I_{PTAT}$ as transistor $Q_6$ of voltage reference circuit $X_1$.

Comparator $X_3$ can supply a valid output signal as long as at least one of its input voltages respectively at terminals $V_{BG}$ or $V_{MON}$ is higher than the sum of the threshold voltage $U_{TH37}$ or $U_{TH38}$ of transistor $M_{37}$ or $M_{38}$, and the saturation voltage $U_{CE10.sat}$ of bipolar transistor $Q_{10}$, i.e., in general higher than the sum of a threshold voltage $U_{THN}$ of an NMOS transistor and the saturation voltage $U_{CE.sat}$ of a bipolar transistor, yielding:

$$\min(U_{VBG}, U_{VMON}) > U_{THN} + U_{CE.sat} \quad (7)$$

Inequality (7) can easily be satisfied by suitable selection of NMOS transistors $M_{37}$ and $M_{38}$, and of a reference voltage $U_{VBG}$=1.25 V.

The result of AND gate $X_4$ downstream from comparator $X_3$ in FIG. 4 is that the output signal of Schmitt trigger $X_6$ is not evaluated until the internal operating voltage $U_{VDDI}$ is sufficiently high that the comparator can function and the reference voltage $U_{VBG}$ has reached its target value, i.e., when inequalities (6) and (7) are both satisfied.

Figure 5:
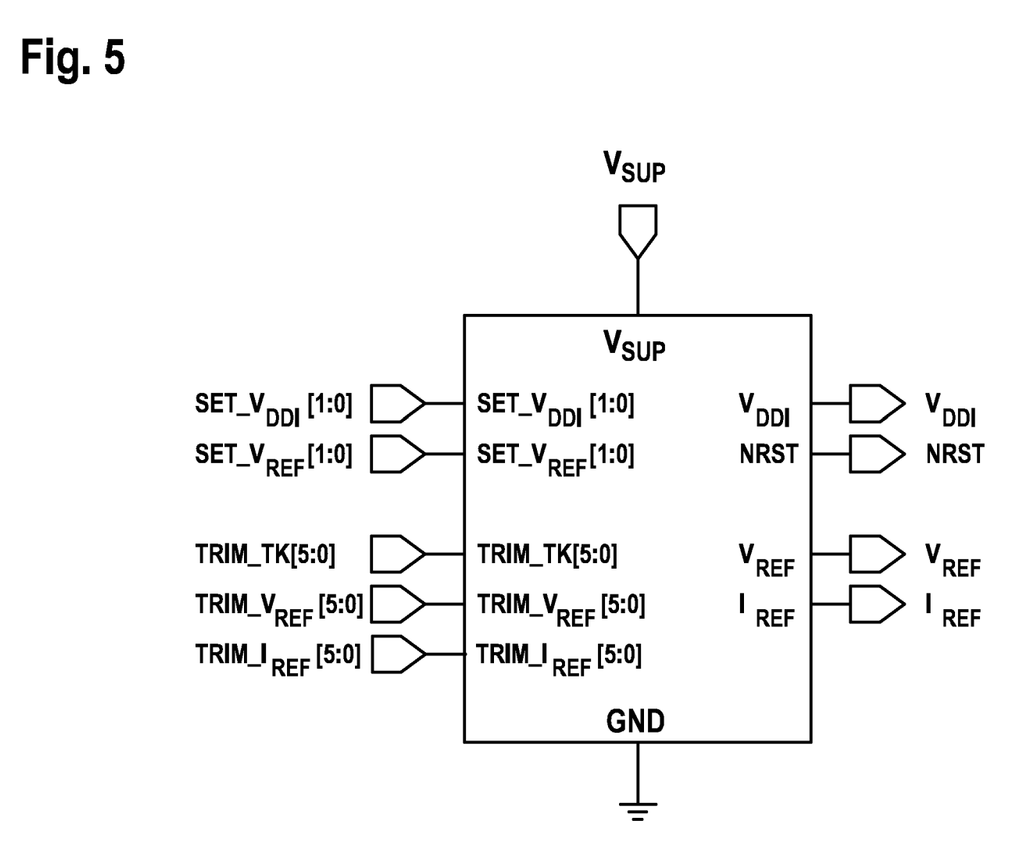
FIG. 5 shows an exemplifying embodiment of a basic cell according to the present invention for a primary voltage supply.

FIG. 5 shows an exemplifying embodiment of a basic cell according to the present invention for a primary voltage supply with which a primary operating voltage is made available at terminal $V_{DDI}$, a primary reference voltage at terminal $V_{REF}$, a primary reference current at terminal $I_{REF}$, and a primary reset signal, for indicating under- or over-voltage, at terminal NRST. The basic cell can be powered from an unregulated voltage source via terminal $V_{SUP}$. Provision is advantageously made to make the available operating voltage $V_{DDI}$ and reference voltage $V_{REF}$ configurable with the aid of the respective control signals SET_VDDI[1:0] and SET_VREF[1:0], for example where $U_{VDDI}$=5.0 V/4.5 V/3.3 V/2.5 V and where $U_{VREF}$=1.25 V/1.2 V/1.0 V/0.8 V. A trimming functionality is furthermore provided via terminals TRIM_TK[5:0], TRIM_VREF [5:0], and TRIM_IREF[5:0] provided on the basic cell.

A different topology can also be selected for voltage reference circuit $X_1$ and voltage regulator $X_2$, as long as the principle of the present invention, according to which voltage regulator $X_2$ is prevented from regulating to a voltage lower than the one required in order to enable voltage reference circuit $X_1$ to ramp up, is adhered to.

Because such an intervention need not necessarily be made in the output stage of voltage regulator $X_2$, it would also be possible to expand the differential amplifier of voltage regulator $X_2$ to include a second and a third positive input in order to deliver to it, in addition to the reference voltage $V_{BG}$, a second and a third command variable that then set a lower limit for the operating voltage. For that purpose, for example, the voltage values on the right side of the inequalities recited above could be divided down by circuit engineering at the same ratio as the operating voltage that is divided down with the aid of resistors $R_8$ to $R_{10}$, in order then to deliver them to those additional inputs. If the intervention is made in the differential amplifier of voltage regulator $X_2$, then a PMOS output transistor can also be used instead of NMOS output transistor $M_{32}$. The internal operating voltage $U_{VDDI}$ could then come very close to the external supply voltage $U_{VSUP}$.

Instead of intervening in the differential amplifier or the output stage, it is also possible to use, in voltage regulator $X_2$, a second output transistor whose gate is not influenced at all by the differential amplifier but instead is raised respectively to the higher of the two voltages $U_{G30}$ or $U_{G31}$ plus a threshold voltage $U_{THP}$ of a PMOS transistor and a threshold voltage $U_{THN}$ of an NMOS transistor. The two aforementioned inequalities (3) and (4) can be satisfied in this case as well.

An output stage, in particular an AB output stage, is also not obligatory for voltage regulator $X_2$. If transistors $M_{30}$ and $M_{31}$ were inserted between the source terminal of transistor $M_{19}$ and the drain terminal of transistor $M_{21}$ in FIG. 3, the lower voltage value at the output of the differential amplifier would be limited in accordance with inequalities (3) and (4). In this case, output transistor $M_{32}$ would be connected at its gate terminal directly to the output of the differential amplifier, and likewise cascode transistors $M_{18}$ and $M_{19}$ at their gate terminals.

Generally, any desired topology can be selected for voltage reference circuit $X_1$. In accordance with inequalities (1) and (2), it is necessary to ascertain the conditions that must be satisfied in order to enable that circuit to ramp up.

Cascode transistors can be used both for $M_6$, $M_7$, $M_9$ and $M_{14}$ to $M_{17}$, and for $Q_3$ and $Q_4$, in order to increase the power supply rejection ratio, although this is not depicted in FIG. 3.

Because the power consumption of voltage reference circuit $X_1$ can be in the single-digit µA range, provision can be made to use an RC filter, having a series resistor in the range of a few 10 s to 100 kilohm, as an input filter for the operating voltage of the voltage reference circuit.

A timing element can delay the trailing edge of the NRBG signal in order to implement a defined power-on reset phase even in a context of smaller, shorter interruptions in the operating voltage.

What is claimed is:

1. An electrical circuit comprising:
    a voltage reference circuit; and
    a voltage regulator that is configured to obtain a reference voltage from the voltage reference circuit and furnish a regulated operating voltage that is supplied to the voltage reference circuit;
    wherein the electrical circuit has at least one of the following four features (a)-(d):
    (a) the electrical circuit is configured to use control signals of the voltage reference circuit to prevent the voltage regulator from outputting the regulated operating voltage at a value that is determined to be too low for a voltage ramp-up;
    (b) the electrical circuit further comprises:
        a comparator configured to compare the regulated operating voltage and the reference voltage; and
        an AND gate that is configured to:
            evaluate an output signal of the comparator and a signal that is (i) output by the voltage reference circuit and (ii) indicates whether the value of the regulated operating voltage is high enough to make the reference voltage available; and
            output a reset signal based on the evaluation, the reset signal being generated in consideration of the regulated operating voltage and the reference voltage;
    (c) the voltage regulator includes:
        a first positive input by which the voltage regulator is configured to obtain the reference voltage from the voltage reference circuit; and
        a differential amplifier that has a second positive input and a third positive input by which two command variables, other than the reference voltage, is obtainable by the voltage regulator to set a lower limit for the regulated operating voltage of the voltage regulator; and
    (d) the electrical circuit is configured to prevent the voltage regulator from regulating the operating voltage to be lower than that which is required for ramp-up of the voltage reference circuit.

2. The electrical circuit as recited in claim 1, wherein the electrical circuit is configured to use the control signals of the voltage reference circuit to prevent the voltage regulator from outputting the regulated operating voltage at the value that is determined to be too low for the voltage ramp-up.

3. The electrical circuit as recited in claim 2, wherein the control signals are analog control signals and the voltage regulator is configured to evaluate the analog control signals of the voltage reference circuit.

4. The electrical circuit as recited in claim 1, wherein the electrical circuit comprises the comparator configured to compare the regulated operating voltage and the reference voltage.

5. The electrical circuit as recited in claim 4, wherein the electrical circuit comprises the AND gate.

6. The electrical circuit as recited in claim 5, further comprising:
    a timing element configured to delay a trailing edge of the signal (i) that is output by the voltage reference circuit and (ii) which the AND gate is configured to evaluate.

7. The electrical circuit as recited in claim 1, further comprising:
    a voltage divider configured to divide down the regulated operating voltage.

8. The electrical circuit as recited in claim 1, wherein the voltage reference circuit includes a current mirror configured to adjust a working point of transistors provided in the voltage reference circuit.

9. The electrical circuit as recited in claim 1, wherein the voltage regulator includes a current mirror which provides that an internal operating voltage tracks an external operating voltage during ramp-up.

10. The electrical circuit as recited in claim 1, wherein voltage regulator includes the first positive input and the differential amplifier.

11. The electrical circuit as recited in claim 10, wherein the second positive input and the third positive input are configured to prevent the voltage regulator from regulating the regulated operating voltage to lower than that which is necessary in order to allow the voltage reference circuit to ramp up and to reach a target value of the voltage reference circuit.

12. The electrical circuit as recited in claim 10, wherein the second and third command variables are input voltages besides the reference voltage, and the electrical circuit is configured to prevent a gate of an output transistor from being pulled down during ramp-up of two of the input voltages of the differential amplifier, by limiting, using transistors, a voltage value to which an output stage can pull the gate of the output transistor.

13. The electrical circuit as recited in claim 1, wherein the voltage regulator includes at least two output transistors.

14. The electrical circuit as recited in claim 1, wherein the electrical circuit is configured to prevent the voltage regulator from regulating the operating voltage to be lower than required for the ramp-up of the voltage reference circuit.

15. The electrical circuit as recited in claim 1, wherein the reference voltage is furnished by the voltage reference circuit based on the supply of the regulated operating voltage to the voltage reference circuit, and the electrical circuit is configured to signal that a target for voltage ramp up or ramp down has been attained based on the reference voltage.

16. The electrical circuit as recited in claim 1, wherein the electrical circuit is configured to use the reference voltage to regulate the operating voltage during voltage ramp up to prevent an undervoltage.

17. The electrical circuit as recited in claim 1, wherein the electrical circuit is configured to use the reference voltage to regulate the operating voltage during voltage ramp down to prevent an overvoltage.

18. The electrical circuit as recited in claim 1, wherein the voltage regulator is configured to regulate the operating voltage in accordance with the reference voltage obtained from the voltage reference circuit conditional on the operating voltage supplied by the voltage regulator to the voltage reference circuit reaching a predefined target value.

19. The electrical circuit as recited in claim 1, wherein the electrical circuit is configured to signal that a target for voltage ramp up or ramp down has been attained conditional upon the operating voltage supplied by the voltage regulator to the voltage reference circuit reaching a predefined target value.

* * * * *